US011320846B2

(12) United States Patent
Wang et al.

(10) Patent No.: US 11,320,846 B2
(45) Date of Patent: May 3, 2022

(54) DIFFERENTIAL REFERENCE VOLTAGE BUFFER

(71) Applicant: NO. 24 RESEARCH INSTITUTE OF CHINA ELECTRONICS TECHNOLOGY GROUP CORPORATION, Chongqing (CN)

(72) Inventors: Yan Wang, Chongqing (CN); Gangyi Hu, Chongqing (CN); Tao Liu, Chongqing (CN); Jian'an Wang, Chongqing (CN); Daiguo Xu, Chongqing (CN); Guangbing Chen, Chongqing (CN); Dongbing Fu, Chongqing (CN)

(73) Assignee: NO. 24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 0 days.

(21) Appl. No.: 17/258,159

(22) PCT Filed: Dec. 13, 2018

(86) PCT No.: PCT/CN2018/120781
§ 371 (c)(1),
(2) Date: Jan. 6, 2021

(87) PCT Pub. No.: WO2020/037894
PCT Pub. Date: Feb. 27, 2020

(65) Prior Publication Data
US 2021/0278867 A1 Sep. 9, 2021

(30) Foreign Application Priority Data

Aug. 23, 2018 (CN) .......................... 201810963566.2

(51) Int. Cl.
*G05F 1/46* (2006.01)
*G05F 3/24* (2006.01)

(52) U.S. Cl.
CPC .............. *G05F 1/461* (2013.01); *G05F 1/468* (2013.01); *G05F 3/242* (2013.01)

(58) Field of Classification Search
None
See application file for complete search history.

(56) References Cited

U.S. PATENT DOCUMENTS 5,668,468 A * 9/1997 Cargill .................... G05F 3/242
323/316
6,329,849 B1 12/2001 Czarnul et al.
7,570,108 B2 * 8/2009 Morgan .................... G05F 1/56
327/513

* cited by examiner

*Primary Examiner* — Jeffery S Zweizig

(57) ABSTRACT

The present disclosure provides a differential reference voltage buffer, including: a buffer stage, including at least a first transistor and a second transistor; a control circuit, connected with the buffer stage and forming a negative feedback structure for generating a differential reference voltage; a current compensation circuit for compensating a resistive load current of the control circuit; and a drive stage for generating an output differential reference voltage. The differential reference voltage is generated according to an external input reference voltage and a common mode input voltage. The common mode voltage can be set separately, so that the flexibility is high. The current generated by a resistive network in the control circuit is compensated by the current compensation circuit, so that the current of a follow device in the buffer stage is not influenced by the control circuit, thereby generating a differential reference voltage with high accuracy output.

18 Claims, 2 Drawing Sheets

DIFFERENTIAL REFERENCE VOLTAGE BUFFER

CROSS REFERENCES TO RELATED APPLICATIONS

This is a Sect. 371 National Stage application of a PCT International Application No. PCT/CN2018/120781, filed on Dec. 13, 2018, which claims priority of a Chinese Patent Applications No. 2018109635662, filed on Aug. 23, 2018, the content of which is hereby incorporated by reference in its entirety for all purposes.

TECHNICAL FIELD

The present disclosure relates to the field of integrated circuits, and in particular, to a differential reference voltage buffer.

BACKGROUND

In many integrated circuits and circuit units, such as analog-to-digital converters (ADCs), digital-to-analog converters (DACs), linear regulators and switching regulators, precise and stable differential reference voltage source are required. An ideal reference voltage source is not affected by power and temperature, and can provide a stable voltage in the circuit. In an analog-to-digital converter ADC, such as a pipelined or successive approximation analog-to-digital converter structure, due to that the capacitance of the sampling is usually large, a differential reference voltage buffer is needed to differentially convert the reference voltage from the bandgap reference circuit and buffer the output, which can provide a large output current when needed, so that the circuit can quickly, accurately and efficiently complete the signal establishment.

At present, the circuit structure of a traditional differential reference voltage buffer usually includes three parts: a differential voltage source generation circuit, a buffer stage, and a drive stage. The working principle is as follows: first, the differential voltage source generation circuit performs a differential conversion on a reference voltage and outputs differential reference voltages $V_{refp}$ and $V_{refn}$; then, the buffer stage performs source follower output on the differential reference voltages $V_{refp}$ and $V_{refn}$; finally, the drive stage provides a low impedance and large current, and outputs differential reference voltages $V_{REFOUTP}$ and $V_{REFOUTN}$, which are equal to $V_{refp}$ and $V_{refn}$, respectively. In the differential reference voltage buffer circuit, the structure of the buffer stage combined with the drive stage is generally adopted due to its advantages of speediness and low power consumption. However, the traditional differential reference voltage buffer also has obvious shortcomings. On the one hand, in order to ensure the high accuracy and response speed of the voltage buffer, the common mode voltage of the differential reference voltage cannot be set separately, which limits the application of the buffer. On the other hand, if the common mode voltage of the differential reference voltage can be set separately, the resistance feedback network would generate a current to flow into the buffer stage, which makes that the ratio of the current of the source follower device in the buffer stage to the current of the source follower device in the drive stage is not equal to the size ratio of the source follower devices. The output $V_{REFOUTP}$ and $V_{REFOUTN}$ of the drive stage is thus unequal to the output $V_{refp}$ and $V_{refn}$ of the buffer stage, which leads to a bias voltage. In addition, since the corresponding relationship between the current and the gate-source voltage is related to temperature, the offset voltage varies with temperature, resulting in a decrease in the performance and stability of the reference.

SUMMARY

The present disclosure provides a differential reference voltage buffer, to solve the above-mentioned problems.

The differential reference voltage buffer of the present disclosure includes:

a buffer stage, including at least a first transistor and a second transistor;

a control circuit, connected with the buffer stage to form a negative feedback structure for generating a differential reference voltage; the control circuit includes at least a first operational amplifier, a first resistor, a second resistor, and a common mode feedback circuit; the first operational amplifier includes two input ends, the first input end of the first operational amplifier is connected with the source of the first transistor and the common mode feedback circuit through the first resistor, and the second input end of the first operational amplifier is connected with the source of the second transistor and the common mode feedback circuit through the second resistor;

a current compensation circuit to compensate a resistive load current of the control circuit; and a drive stage to generates an output differential reference voltage.

Further, the current compensation circuit includes a second operational amplifier, a third operational amplifier, a third resistor and a fourth resistor;

the second operational amplifier includes two input ends, the first input end of the second operational amplifier is connected with the source of the first transistor, and the second input end of the second operational amplifier is connected with the signal ground through the third resistor;

the third operational amplifier includes two input ends, the first input end of the third operational amplifier is connected with the source of the second transistor, and the second input end of the third operational amplifier is connected with the input voltage $V_{ref}$ through the fourth resistor.

Further, the current compensation circuit includes a third transistor and a fourth transistor. The first input end of the second operational amplifier is connected with the current treatment end of the third transistor. The second input end of the second operational amplifier is connected with the current treatment end of the fourth transistor. The output end of the second operational amplifier is connected with the gate of the third transistor and the gate of the fourth transistor, respectively.

Further, the current compensation circuit includes a fifth transistor and a sixth transistor. The first input end of the third operational amplifier is connected with the current treatment end of the fifth transistor. The second input end of the third operational amplifier is connected with the current treatment end of the sixth transistor. The output end of the third operational amplifier is connected with the gate of the fifth transistor and the gate of the sixth transistor, respectively.

Further, the control circuit includes a fifth resistor and a sixth resistor. The first input end of the first operational amplifier is connected with the signal ground through the fifth resistor, and the second input end of the first operational amplifier is connected with the input voltage $V_{ref}$ through the sixth resistor.

Further, the common mode feedback circuit includes a fourth operational amplifier, a seventh resistor and an eighth resistor.

One end of the seventh resistor and one end of the eighth resistor are two input ends of the detection level of the common mode feedback circuit. The other end of the seventh resistor and the other end of the eighth resistor are respectively connected with the first input end of the fourth operational amplifier. The second input end of the fourth operational amplifier is the common mode level input end of the common mode feedback circuit, and the output end of the fourth operational amplifier is the output end of the common mode feedback circuit.

Further, the first operational amplifier includes an output end, which is connected with the gate of the first transistor. The gate of the second transistor is connected with the output end of the common mode feedback circuit. The first transistor and the second transistor form a source follower and share a bias current.

Further, the first operational amplifier includes two output ends and a common mode feedback input end. The first output end of the first operational amplifier is connected with the gate of the first transistor. The first output end of the second operational amplifier is connected with the gate of the second transistor. The common mode feedback input end is connected with the output end of the common mode feedback circuit. The first transistor and the second transistor are respectively connected to the control circuit and form a source negative feedback mode.

Further, the first input end of the second operational amplifier is a negative input end, the second input end of the second operational amplifier is a positive input end. The third transistor and the fourth transistor are PMOS transistors. The current treatment end of the third transistor is the drain of the third transistor, and the current treatment end of the fourth transistor is the drain of the fourth transistor.

Further, the first input end of the second operational amplifier is a positive input end, the second input end of the second operational amplifier is a negative input end. The third transistor and the fourth transistor are NMOS transistors. The current treatment end of the third transistor is the source of the third transistor, and the current treatment end of the fourth transistor is the source of the fourth transistor.

Further, the first input end of the third operational amplifier is a negative input end, the second input end of the third operational amplifier is a positive input end. The fifth transistor and the sixth transistor are NMOS transistors. The current treatment end of the fifth transistor is the drain of the fifth transistor, and the current treatment end of the sixth transistor is the drain of the sixth transistor.

Further, the first input end of the third operational amplifier is a positive input end, the second input end of the third operational amplifier is a negative input end. The fifth transistor and the sixth transistor are PMOS transistors. The current treatment end of the fifth transistor is the source of the fifth transistor, and the current treatment end of the sixth transistor is the source of the sixth transistor.

Further, the resistance value of the third resistor is the sum of the resistance value of the first resistor and the resistance value of the fifth resistor; the resistance value of the fourth resistor is the sum of the resistance value of the second resistor and the resistance value of the sixth resistor.

Further, the current compensation circuit includes a ninth resistor. One end of the ninth resistor is connected with the first input end of the second operational amplifier, and the other end of the ninth resistor is connected with the second input end of the third operational amplifier. The resistance value of the ninth resistor is the sum of the resistance value of the seventh resistor and the resistance value of the eighth resistor.

Further, the buffer stage includes a pass device. The source of the first transistor and the source of the second transistor are connected through the pass device. The pass device includes one or more transistors connected in the form of a diode.

Further, the buffer stage includes an eleventh transistor, the source of the first transistor is connected with the drain of the second transistor, the source of the second transistor is connected with the drain of the eleventh transistor, and the source of the eleventh transistor is grounded.

Further, the drive stage includes a second pass device, a seventh transistor, and an eighth transistor;

The seventh transistor and the eighth transistor form source followers. The gate of the seventh transistor is connected with the gate of the first transistor, the gate of the eighth transistor is connected with the gate of the second transistor, and the source of the seventh transistor is connected with the source of the eighth transistor through the second pass device.

Further, the drive stage includes a seventh transistor, an eighth transistor, and a twelfth transistor. The gate of the seventh transistor is connected with the gate of the first transistor, the gate of the eighth transistor is connected with the gate of the second transistor, the source of the seventh transistor is connected to the drain of the eighth transistor, the source of the eighth transistor is connected with the drain of the twelfth transistor, and the source of the twelfth transistor is grounded.

The present disclosure has the following beneficial effects: the differential reference voltage buffer of the present disclosure could generate a differential reference voltage according to an external input reference voltage and a common mode input voltage. The common mode voltage can be set separately, so that the flexibility is high. The current generated by a resistive network in the control circuit is compensated by the current compensation circuit, so that the current of a follow device in the buffer stage is not influenced by the control circuit. The ratio of the current of the follow devices in the buffer stage and the drive stage is the same as the ratio of the size of the follow devices, which can generate a differential reference voltage that is outputted at high accuracy. The drive stage operates in an open-loop state and has a fast response speed, so that the present disclosure has high accuracy, fast response, and the common mode voltage can be set independently.

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure. It needs to be stated that the following embodiments and the features in the embodiments can be combined with one another under the situation of no conflict.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during the actual implementation thereof may be freely changed, and the component layout configuration thereof may be more complicated.

The differential reference voltage buffer in this embodiment mainly includes four parts: a control circuit 301, a buffer stage 302, a current compensation circuit 303, and a drive stage 304.

The buffer stage 302 includes at least a first transistor and a second transistor.

The control circuit 301 is connected with the buffer stage and forms a negative feedback structure to generate a differential reference voltage. The control circuit includes at least a first operational amplifier A1, a first resistor R1, a second resistor R2, and a common mode feedback circuit 3012. The first operational amplifier A1 includes two input ends. The first input end is connected with the source of the first transistor M1 and the common mode feedback circuit 3012 through the first resistor R1, and the second input end is connected with the source of the second transistor M2 and the common mode feedback circuit 3012 through the second resistor R2.

The current compensation circuit 303 compensates a resistive load current of the control circuit 301.

The drive stage 304 generates an output differential reference voltage.

Figure 1:
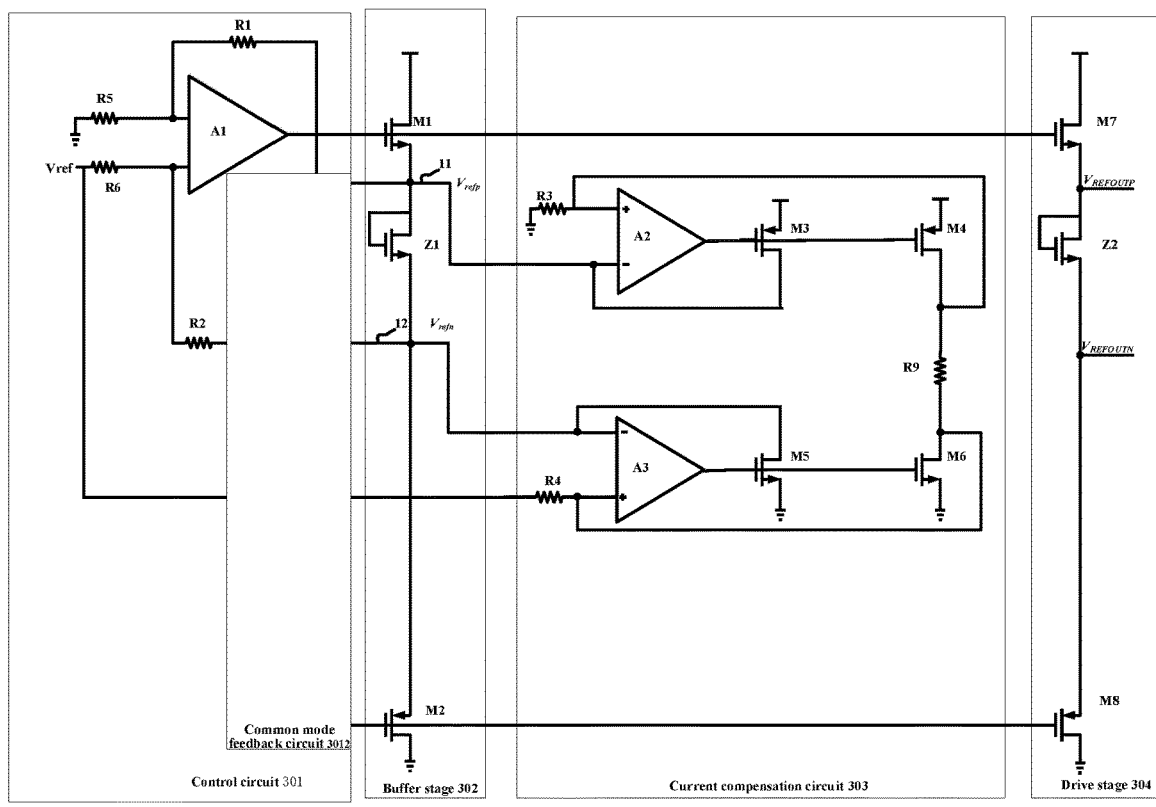
FIG. 1 is a schematic diagram of an embodiment of the differential reference voltage buffer circuit according to the present disclosure.

As shown in FIG. 1, in this embodiment, the control circuit 301 receives the reference voltage $V_{ref}$ and the common mode voltage $V_{CM}$, and outputs differential reference voltages $V_{refp}$ and $V_{refn}$. The value of the differential mode voltage is $V_{ref}$ and the value of the common mode voltage is $V_{CM}$. The buffer stage 302 is connected with the control circuit 301 in a negative feedback form, and the output node of the buffer stage 302 is the same as the output node of the control circuit 301. The current compensation circuit 303 is used to compensate for the resistive load current in the control circuit 301, such that the current of the source follower device in the buffer stage 302 is not affected by the control circuit. The drive stage 304 in this embodiment is a copy of the buffer stage 302. The drive stage 304 provides low impedance and large driving capability, and outputs differential reference voltages $V_{REFOUTP}$ and $V_{REFOUTN}$, which are equal to $V_{refp}$ and $V_{refn}$, respectively. The value of the differential mode voltage is $V_{ref}$ and the value of the common mode voltage is $V_{CM}$.

The control circuit 301 in this embodiment includes a single-end-output first operational amplifier A1, a common mode feedback circuit 3012, and four resistors (a first resistor R1, a second resistor R2, a fifth resistor R5 and a sixth resistor R6; R1=R2=R5=R6). The common mode feedback circuit 3012 includes a single-end-output operational amplifier A4, a seventh resistor R7 and an eighth resistor R8, and R7=R8. One input end of the first operational amplifier A1 is connected with the signal ground through the fifth resistor R5, and at the same time connected with the line 11 (the voltage is denoted as $V_{refp}$) through the first resistor R1. The other input end of the first operational amplifier A1 is connected to the reference voltage $V_{ref}$ through the sixth resistor R6, and at the same time connected to the line 12 (the voltage is denoted as $V_{refn}$) through the second resistor R2. Since the gain of the first operational amplifier A1 is high, the input end forms a "virtual ground", thus the voltages $V_{refp}$ and $V_{refn}$ satisfy the following equation:

$$V_{refp} - V_{refn} = V_{ref} \tag{1}$$

One input end of the operational amplifier A4 in the common mode feedback circuit 3012 is connected with the voltage $V_{CM}$, the other input end is connected with one end of the seventh resistor R7 and the eighth resistor R8. The other end of the seventh resistor R7 and the eighth resistor R8 is connected with the line 11 and line 12, respectively, and the voltage $V_{refp}$ and $V_{refn}$ are read in common mode. Since the gain of the operational amplifier A4 is high, the input end forms a "virtual ground", thus the voltages $V_{refp}$ and $V_{refn}$ satisfy the following equation:

$$V_{refp} + V_{refn} = 2V_{CM} \tag{2}$$

Therefore, the differential reference voltages $V_{refp}$ and $V_{refn}$ output by the control circuit 301 have a differential mode voltage of $V_{ref}$ and a common mode voltage of $V_{CM}$. The common mode voltage can be set independently, so that the flexibility is high.

The buffer stage 302 includes a source follower device a first transistor M1 and a second transistor M2, and a pass device Z1. The first transistor M1 is an NMOS transistor, the second transistor M2 is a PMOS transistor, and the pass device Z1 is realized by a diode-connected NMOS transistor. The gate of the first transistor M1 is connected with the output of the operational amplifier A1 in the control circuit 301, the drain of the first transistor M1 is connected with the power supply voltage, and the source of the first transistor M1 is connected with the line 11 to generate a voltage $V_{refp}$. One end of the pass device Z1 is connected with the line 11 and the other end is connected with the line 12. The gate of the second transistor M2 is connected with the output of the operational amplifier A4 in the control circuit 301, the drain of the second transistor M2 is connected with the ground voltage, and the source of the second transistor M2 is connected with the line 12 to generate a voltage $V_{refn}$.

The current compensation circuit 303 includes a second operational amplifier A2 and a third operational amplifier A3, a third transistor M3 and a fourth transistor M4, a fifth transistor M5 and a sixth transistor M6, a third resistor R3, a fourth resistor R4, and a ninth resistor R9. The third transistor M3 and the fourth transistor M4 are PMOS transistors, and the fifth transistor M5 and the sixth transistor M6 are NMOS transistors.

$$R3 = R1 + R5 \tag{3}$$

$$R4 = R2 + R6 \tag{4}$$

$$R9 = R7 + R8 \tag{5}$$

The sizes of the fourth transistor M4 and the sixth transistor M6 are the same as those of the third transistor M3 and the fifth transistor M5, respectively. The negative input end of the second operational amplifier A2 is connected with the line 11 and at the same time connected with the drain of the third transistor M3. The positive input end of the second operational amplifier A2 is connected with the signal ground through the third resistor R3, and at the same time connected with the drain of the fourth transistor M4. The output end of the second operational amplifier A2 is connected with the gates of the third transistor M3 and the fourth transistor M4. The negative input end of the third operational amplifier A3 is connected with the line 12 and at the same time connected with the drain of the fifth transistor M5. The positive input end of the third operational amplifier A3 is connected with the reference voltage $V_{ref}$ through the fourth resistor R4, and at the same time connected with the drain of the sixth transistor M6. The output end of the third operational amplifier A3 is connected with the gates of the fifth transistor M5 and the sixth transistor M6. One end of the ninth resistor R9 is connected with the drain of the fourth transistor M4, and the other end is connected with the drain of the sixth transistor M6.

Figure 2:
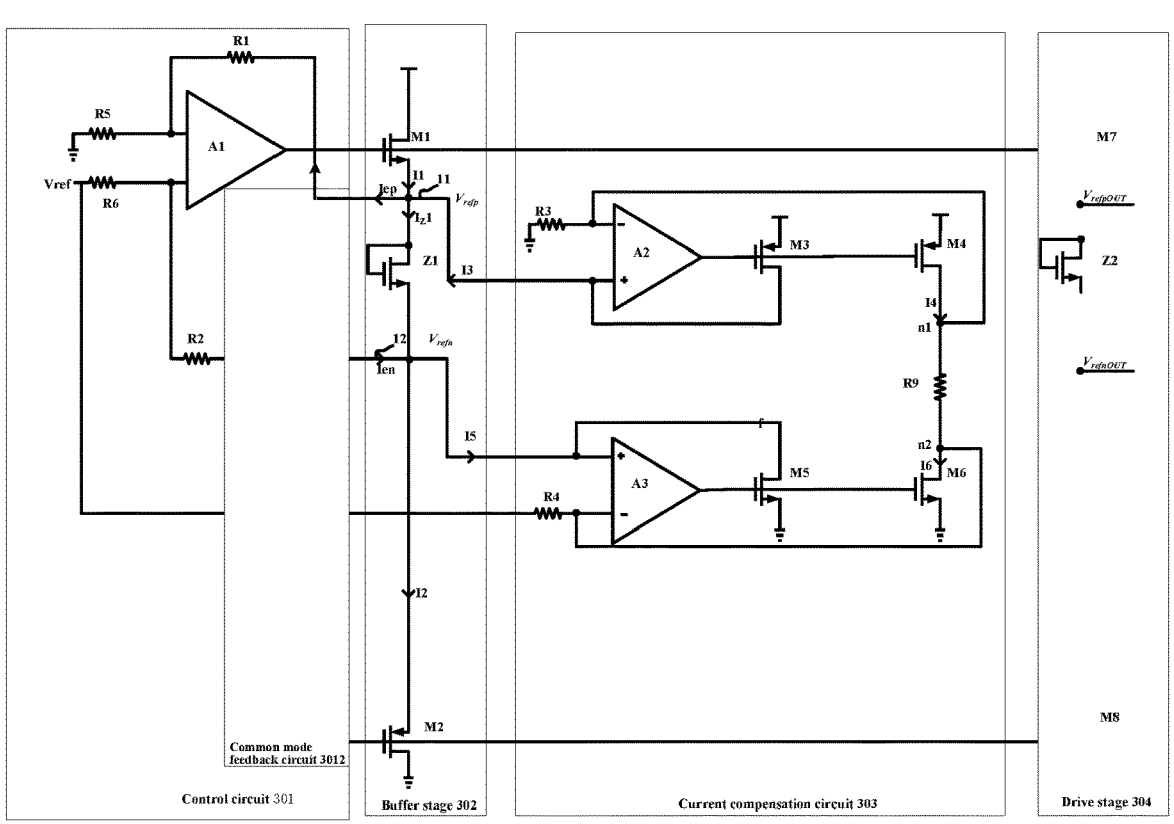
FIG. 2 is a schematic diagram illustrating a current of a differential reference voltage buffer circuit according to an embodiment of the present disclosure.

As shown in FIG. 2, since the two input ends of the second operational amplifier A2 are "virtually grounded", the drain end voltage Vn1 of the fourth transistor M4 equals to $V_{refp}$. Similarly, the drain end voltage Vn2 of the sixth transistor M6 equals to $V_{refn}$. Therefore, the leakage current I4 flowing through the fourth transistor M4 is:

$$I4 = Vn1/R3 + (Vn1-Vn2)/R9 = V_{refp}/R3 + (V_{refp}-V_{refn})/R9 \quad (6)$$

Since the gate voltage, the source voltage, and the drain voltage of the third transistor M3 and the fourth transistor M4 are equal, and the third transistor M3 and the fourth transistor M4 have the same size, the leakage currents flowing through the third transistor M3 and the fourth transistor M4 are equal, that is, $$I3 = I4 \quad (7)$$

The influence of the control circuit 301 on the current of the buffer stage 302 is shown by the current Iep on the line 11 and the current Ien on the line 12. The two currents flow out/into the source of source follower devices M1 and M2, and affect the leakage current of the source follower devices M1 and M2.

The current Iep includes two parts, one is the current flowing into the first resistor R1 and the fifth resistor R5, and the other is the current flowing into the seventh resistor R7 and the eighth resistor R8 in the common mode feedback circuit 3012. Therefore, the current Iep is:

$$Iep = V_{refp}/(R1+R5) + (V_{refp}-V_{refn})/(R7+R8) \quad (8)$$

Combining equations (3), (5), (6) to (8), the following could be obtained:

$$I3 = Iep \quad (9)$$

The current introduced by the control circuit 301 into the source of the transistor M1 in the buffer stage 302 would equivalently flow to the current compensation circuit 303, so as not to affect the current of the source follower device M1. Then, the leakage current I1 of the first transistor M1 is equal to the current Iz1 flowing into the pass device Z1, that is, $$I1 = Iz1 \quad (10)$$

In the current compensation circuit 303, the leakage current I6 flowing through the transistor M6 is:

$$I6 = (V_{ref}-Vn2)/R4 + (Vn1-Vn2)/R9 = (V_{ref}-V_{refn})/R4 + (V_{refp}-V_{refn})/R9 \quad (11)$$

Since the gate voltage, the source voltage, and the drain voltage of the fifth transistor M5 and the sixth transistor M6 are equal, and the fifth transistor M5 and the sixth transistor M6 have the same size, the leakage currents flowing through the fifth transistor M5 and the sixth transistor M6 are equal, that is, $$I5 = I6 \quad (12)$$

The current Ien flowing out of the control circuit 301 on the line 12 includes two parts, one is the current flowing into the second resistor R2 and the sixth resistor R6, and the other is the current flowing out of the seventh resistor R7 and the eighth resistor R8 in the common mode feedback circuit 3012. Therefore, the current Ien is $$Ien = (Vref-V_{refn})/(R2+R6) + (V_{refp}-V_{refn})/(R7+R8) \quad (13)$$

Combining equations (3), (5), (11) to (13), the following could be obtained:

$$I5 = Ien \quad (14)$$

The current introduced by the control circuit 301 to the source of the transistor M2 in the buffer stage 302 would equivalently flow to the current compensation circuit 303, so as not to affect the current of the source follower device M2. Then, the leakage current I2 of the second transistor M2 is equal to the current Iz1 flowing into the pass device Z1, that is, $$I2 = Iz1 \quad (15)$$

Therefore, although the resistor network and the common mode feedback circuit 3012 in the control circuit 301 introduce a current into the buffer stage 302, the current compensation circuit 303 compensates the current so as not to affect the current of the source follower devices M1 and M2. Therefore, the current flowing into the first transistor M1, the second transistor M2 and the pass device Z1 in the buffer stage 302 are all the same.

The buffer stage 304 in this embodiment includes a seventh transistor M7, an eighth transistor M8 and a pass device Z2. The seventh transistor M7 and the eighth transistor M8 are source follower devices. The seventh transistor M7 is an NMOS transistor, the eighth transistor M8 is a PMOS transistor, and the pass device Z2 is realized by a diode-connected NMOS transistor. The size scale of the seventh transistor M7, the eighth transistor M8 and the pass device Z2 are the same as those of the first transistor M1, the second transistor M2 and the pass device Z1. The gate of the seventh transistor M7 is connected with the gate of the first transistor M1 in the buffer stage 302, the drain of the seventh transistor M7 is connected to the power supply voltage, the source of the seventh transistor M7 is connected with one end of the pass device Z2, and the output voltage is $V_{REFOUTP}$. The other end of the pass device Z2 is connected with the source of the eighth transistor M8 and outputs a voltage $V_{REFOUTN}$. The gate of the eighth transistor M8 is connected with the gate of the second transistor M2 in the buffer stage 302, the drain is connected with the ground voltage.

$$V_{REFOUTP} = V_{refp} + VGS1 - VGS7 \quad (16)$$

$$V_{REFOUTN} = V_{refn} - |VGS2| + |VGS8| \quad (17)$$

As described above, the current compensation effect of the current compensation circuit 303, the currents of the source follower devices M1, M2 and the pass device Z1 in the buffer stage 302 are not affected by the control circuit 301, and I1=Iz1=I2. The drive stage 304 is a copy of the buffer stage 302 with the same size scale. Therefore, VGS1=VGS7, VGS22=VGS8.

Therefore, in steady state, $$V_{REFOUTP}=V_{refp}, V_{REFOUTN}=V_{refn} \quad (18)$$

Therefore, the differential reference voltage buffer in this embodiment can achieve high precision, high performance, and fast response, and output differential reference voltages $V_{REFOUTP}$ and $V_{REFOUTN}$. The differential mode voltage is $V_{ref}$, the common mode voltage is $V_{CM}$. The common mode voltage can be set independently, so that the flexibility is high.

Figure 3:
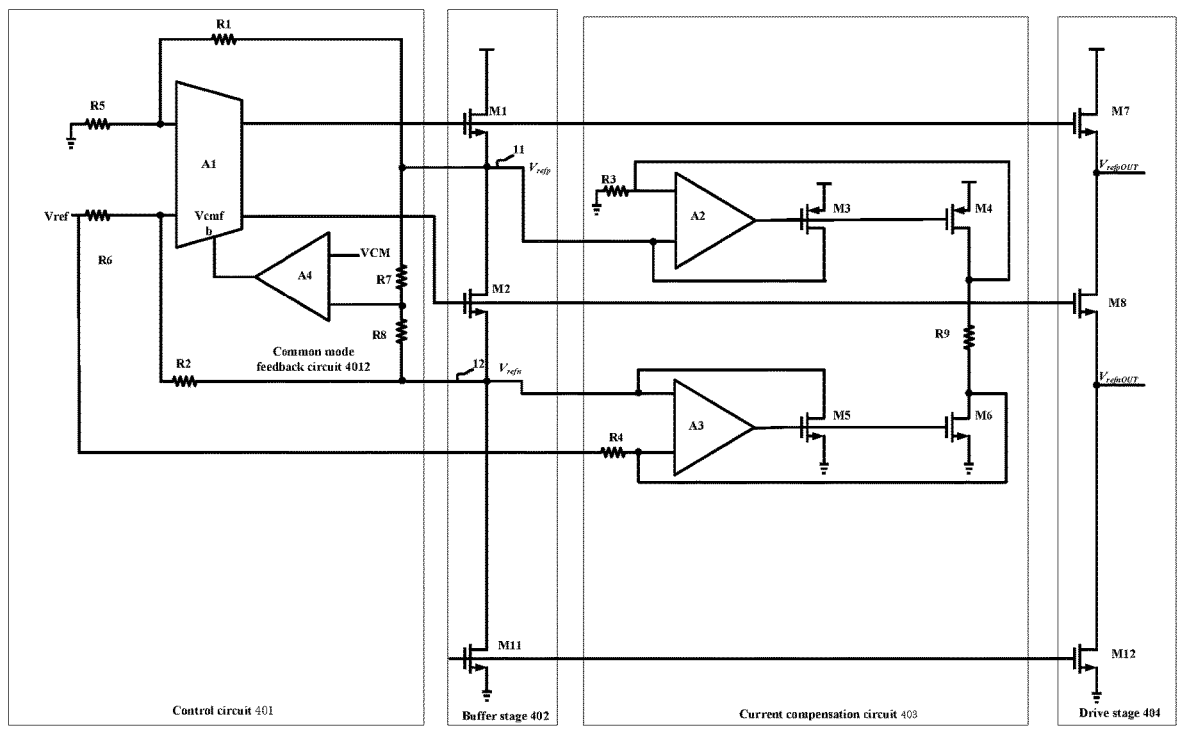
FIG. 3 is a schematic diagram of a second embodiment of the differential reference voltage buffer circuit according to the present disclosure.

As shown in FIG. 3, a second embodiment of the present disclosure also includes four parts: a control circuit 401, a buffer stage 402, a current compensation circuit 403, and a drive stage 404. The current compensation circuit 403 has the same structure as the current compensation circuit 303 shown in FIG. 1. The structure of the control circuit 401, the buffer stage 402, and the drive stage 404 is different from the embodiment shown in FIG. 1, but the functions are the same. Specifically, the first operational amplifier A1 in the control circuit 401 is a double-end-output operational amplifier. The output of the first operational amplifier A1 is respectively connected with the gates of the first transistor M1 and the second transistor M2 in the buffer stage 402. The output of the common mode feedback circuit 4012 is connected with the common mode feedback input end Vcmfb of the first operational amplifier A1. The buffer stage 402 includes a first transistor M1, a second transistor M2 and an eleventh transistor M11. The first transistor M1 and the second transistor M2 are connected with the control circuit 401 in the form of source negative feedback, and generate differential voltages $V_{refp}$ and $V_{refn}$ according to the input signals $V_{ref}$ and $V_{CM}$. The eleventh transistor M11 serves as a current source to provide a bias current for the buffer stage 402. The drive stage 404 has the same structure as the buffer stage 402. The size ratios of the seventh transistor M7, eighth transistor M8, and twelfth transistor M12 to the first transistor M1, second transistor M2, and eleventh transistor M11 in the buffer stage 402 are the same. The working principle is the same as that described above. Due to the presence of the current compensation circuit 403, the current of the source follower devices M1 and M2 in the buffer stage 402 is not affected by the resistive network (R1, R5, R2, R6, R7, R8) in the control circuit 401, so that the current flowing into the first transistor M1, the second transistor M2, and the eleventh transistor M11 are the same. The size ratios of the seventh transistor M7, the eighth transistor M8, and the twelfth transistor M12 in the drive stage 404 to the first transistor M1, the second transistor M2, and the eleventh transistor M11 in the buffer stage 402 are the same. Therefore, VGS1=VGS7, VGS22=VGS8. Therefore, in steady state, $V_{REFOUTP}=V_{refp}$, $V_{REFOUTN}=V_{refn}$. That is, the differential mode voltage of the output reference voltage nodes $V_{REFOUTP}$, $V_{REFOUTN}$ is $V_{ref}$ and the common mode voltage is $V_{CM}$.

Figure 4:
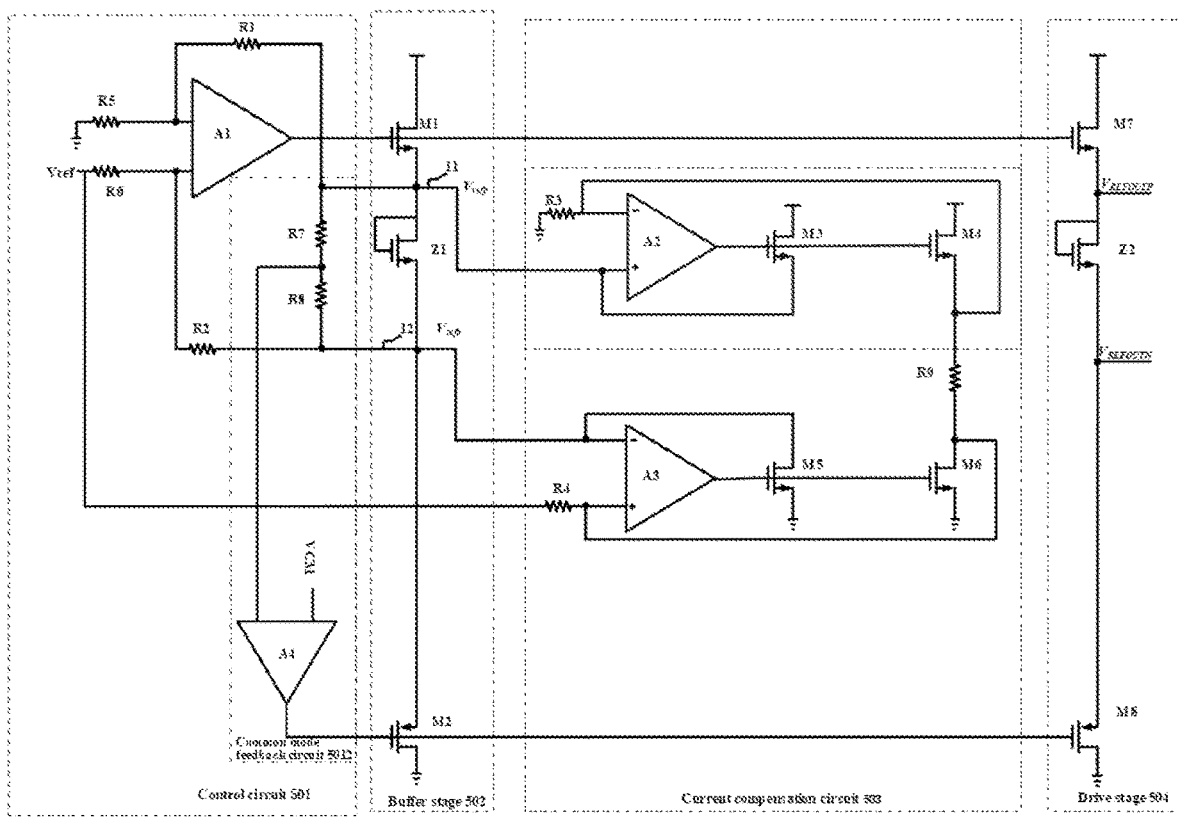
FIG. 4 is a schematic diagram of a third embodiment of the differential reference voltage buffer circuit according to the present disclosure.

As shown in FIG. 4, a third embodiment of the present disclosure also includes four parts: a control circuit 501, a buffer stage 502, a current compensation circuit 503, and a drive stage 504. The only difference between this embodiment and the embodiment in FIG. 1 is the implementation mode of the current compensation circuit. As shown in FIG. 4, in the current compensation circuit 503, the third transistor M3 and the fourth transistor M4 are NMOS transistors. The output end of the second operational amplifier A2 is connected with the gates of the third transistor M3 and the fourth transistor M4. The positive input end of the second operational amplifier A2 is connected with the line 11 of the buffer stage 502, and is at the same time connected with the source of the third transistor M3. The negative input end is connected with the signal ground through the third resistor R3, and is at the same time connected with the source of the fourth transistor M4. The purpose is to make the loop work in the negative feedback mode. Specifically: in the current compensation circuit 503, the second operational amplifier A2 and the third transistor M3 form a positive feedback loop, and the second operational amplifier A2 and the fourth transistor M4 form a negative feedback loop. Since the impedance ZS3 observed at the source of the third transistor M3 is smaller than the impedance Zs4 observed at the source of the fourth transistor M4, the gain of the positive feedback loop is less than the gain of the negative feedback loop, so that the entire loop behaves in the form of negative feedback, and the circuit can work normally. The working principle and function of the current compensation circuit 503 are the same as those of the current compensation circuit 303 in the embodiment in FIG. 1, thus will not be described again. Similarly, the implementation mode of the third operational amplifier A3, the fifth transistor M5, and the sixth transistor M6 in the current compensation circuit 503 may also vary (not shown in the figure). When the fifth transistor M5 and the sixth transistor M6 are PMOS transistors, the output end of the third operational amplifier A3 is connected with the gates of the fifth transistor M5 and the sixth transistor M6. The negative input end of the third operational amplifier A3 is connected with the input signal $V_{ref}$ through the fourth resistor R4, and at the same time connected with the source of the sixth transistor M6. The positive input end of the third operational amplifier A3 is connected with the line 12 of the buffer stage 502, and at the same time connected with the source of the fifth transistor M5. The working principle is the same as the previous one, thus will not be described again.

The above-mentioned embodiments are merely illustrative of the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

The invention claimed is:

1. A differential reference voltage buffer, comprising:
   a buffer stage, comprising at least a first transistor and a second transistor;
   a control circuit, connected with the buffer stage to form a negative feedback structure for generating a differential reference voltage; the control circuit comprises at least a first operational amplifier, a first resistor, a second resistor, and a common mode feedback circuit; the first operational amplifier includes two input ends, a first input end of the first operational amplifier is connected with a source of the first transistor and the common mode feedback circuit through the first resistor, and a second input end of the first operational amplifier is connected with a source of the second transistor and the common mode feedback circuit through the second resistor;
   a current compensation circuit, to compensate for a resistive load current of the control circuit; and
   a drive stage, to generate an output differential reference voltage.

2. The differential reference voltage buffer according to claim 1, wherein the current compensation circuit comprises a second operational amplifier, a third operational amplifier, a third resistor and a fourth resistor;

the second operational amplifier includes two input ends, a first input end of the second operational amplifier is connected with the source of the first transistor, and a second input end of the second operational amplifier is connected with a signal ground through the third resistor;

the third operational amplifier includes two input ends, a first input end of the third operational amplifier is connected with the source of the second transistor, and a second input end of the third operational amplifier is connected with an input voltage Vref through the fourth resistor.

3. The differential reference voltage buffer according to claim 2, wherein the current compensation circuit further comprises a third transistor and a fourth transistor; the first input end of the second operational amplifier is connected with a current treatment end of the third transistor; the second input end of the second operational amplifier is connected with a current treatment end of the fourth transistor, and an output end of the second operational amplifier is connected with a gate of the third transistor and a gate of the fourth transistor, respectively.

4. The differential reference voltage buffer according to claim 2, wherein the current compensation circuit further comprises a fifth transistor and a sixth transistor; the first input end of the third operational amplifier is connected with a current treatment end of the fifth transistor, the second input end of the third operational amplifier is connected with a current treatment end of the sixth transistor, and an output end of the third operational amplifier is connected to a gate of the fifth transistor and a gate of the sixth transistor, respectively.

5. The differential reference voltage buffer according to claim 1, wherein the control circuit further comprises a fifth resistor and a sixth resistor; the first input end of the first operational amplifier is connected with a signal ground through the fifth resistor, and the second input end of the first operational amplifier is connected with an input voltage Vref through the sixth resistor.

6. The differential reference voltage buffer according to claim 1, wherein the common mode feedback circuit comprises a fourth operational amplifier, a seventh resistor and an eighth resistor;

one end of the seventh resistor and one end of the eighth resistor are two input ends of a detection level of the common mode feedback circuit, the other end of the seventh resistor and the other end of the eighth resistor are respectively connected with a first input end of the fourth operational amplifier; a second input end of the fourth operational amplifier is a common mode level input end of the common mode feedback circuit, and an output end of the fourth operational amplifier is an output end of the common mode feedback circuit.

7. The differential reference voltage buffer according to claim 6, wherein the first operational amplifier comprises an output end connected with a gate of the first transistor; a gate of the second transistor is connected with the output end of the common mode feedback circuit; the first transistor and the second transistor form a source follower and share a bias current.

8. The differential reference voltage buffer according to claim 6, wherein the first operational amplifier includes two output ends and a common mode feedback input end; a first output end of the first operational amplifier is connected with a gate of the first transistor; a second output end of the first operational amplifier is connected with a gate of the second transistor; the common mode feedback input end is connected with the output end of the common mode feedback circuit; the first transistor and the second transistor are respectively connected with the control circuit and form a source negative feedback mode.

9. The differential reference voltage buffer according to claim 2, wherein the first input end of the second operational amplifier is a negative input end, the second input end of the second operational amplifier is a positive input end; the third transistor and the fourth transistor are PMOS transistors; a current treatment end of the third transistor is a drain of the third transistor, and a current treatment end of the fourth transistor is a drain of the fourth transistor.

10. The differential reference voltage buffer according to claim 2, wherein the first input end of the second operational amplifier is a positive input end, the second input end of the second operational amplifier is a negative input end; the third transistor and the fourth transistor are NMOS transistors; a current treatment end of the third transistor is a source of the third transistor, and a current treatment end of the fourth transistor is a source of the fourth transistor.

11. The differential reference voltage buffer according to claim 2, wherein the first input end of the third operational amplifier is a negative input end, the second input end of the third operational amplifier is a positive input end; the fifth transistor and the sixth transistor are NMOS transistors; a current treatment end of the fifth transistor is a drain of the fifth transistor, and a current treatment end of the sixth transistor is a drain of the sixth transistor.

12. The differential reference voltage buffer according to claim 2, wherein the first input end of the third operational amplifier is a positive input end, the second input end of the third operational amplifier is a negative input end; the fifth transistor and the sixth transistor are PMOS transistors; a current treatment end of the fifth transistor is a source of the fifth transistor, and a current treatment end of the sixth transistor is a source of the sixth transistor.

13. The differential reference voltage buffer according to claim 5, wherein a resistance value of the third resistor is the sum of a resistance value of the first resistor and a resistance value of the fifth resistor; a resistance value of the fourth resistor is the sum of a resistance value of the second resistor and a resistance value of the sixth resistor.

14. The differential reference voltage buffer according to claim 6, wherein the current compensation circuit further comprises a ninth resistor; one end of the ninth resistor is connected with the first input end of the second operational amplifier, and the other end of the ninth resistor is connected with the second input end of the third operational amplifier; a resistance value of the ninth resistor is the sum of a resistance value of the seventh resistor and a resistance value of the eighth resistor.

15. The differential reference voltage buffer according to claim 7, wherein the buffer stage further comprises a pass device; the source of the first transistor and the source of the second transistor are connected through the pass device; the pass device includes one or more transistors connected in a form of a diode.

16. The differential reference voltage buffer according to claim 8, wherein the buffer stage further comprises an eleventh transistor, the source of the first transistor is connected with a drain of the second transistor, the source of the second transistor is connected with a drain of the eleventh transistor, and a source of the eleventh transistor is grounded.

17. The differential reference voltage buffer according to claim 15, wherein the drive stage comprises a second pass device, a seventh transistor, and an eighth transistor;

the seventh transistor and the eighth transistor form source followers; a gate of the seventh transistor is connected with a gate of the first transistor, a gate of the eighth transistor is connected with a gate of the second transistor, and a source of the seventh transistor is connected with a source of the eighth transistor through the second pass device.

18. The differential reference voltage buffer according to claim 16, wherein the drive stage comprises a seventh transistor, an eighth transistor, and a twelfth transistor; a gate of the seventh transistor is connected with a gate of the first transistor, a gate of the eighth transistor is connected with a gate of the second transistor, a source of the seventh transistor is connected with a drain of the eighth transistor, a source of the eighth transistor is connected with a drain of the twelfth transistor, and a source of the twelfth transistor is grounded.

\* \* \* \* \*